United States Patent [19]

Farooq et al.

[11] Patent Number: 5,532,031

[45] Date of Patent: Jul. 2, 1996

[54] I/O PAD ADHESION LAYER FOR A CERAMIC SUBSTRATE

[75] Inventors: Shaji Farooq, Hopewell Junction; Sampath Purushothaman, Yorktown Heights; Srinivasa S. N. Reddy, LaGrangeville; Vivek M. Sura, Hopewell Junction, all of N.Y.

[73] Assignee: International Business Machines Corporation, Armonk, N.Y.

[21] Appl. No.: 827,657

[22] Filed: Jan. 29, 1992

[51] Int. Cl.$^6$ .............................. B32B 15/04; H01L 23/48
[52] U.S. Cl. .................. 428/623; 428/629; 428/660; 428/680; 428/672; 428/674; 428/675; 428/647; 428/648
[58] Field of Search .................... 428/629, 660, 428/680, 670, 623, 672, 674, 675, 646, 647, 648; 420/560, 561

[56] References Cited

U.S. PATENT DOCUMENTS

| | | | |
|---|---|---|---|
| 2,820,534 | 1/1958 | Hume | 428/660 |
| 3,106,489 | 10/1963 | Lepselter | 428/629 |
| 3,390,969 | 7/1968 | Sullivan et al. | 428/623 |
| 4,301,324 | 11/1981 | Kumar et al. | 174/256 |
| 4,514,751 | 4/1985 | Battacharya | 357/71 |
| 4,643,875 | 2/1987 | Mizuhara | 420/560 |
| 4,693,770 | 7/1987 | Hatada | 156/151 |
| 4,835,593 | 5/1989 | Arnold et al. | 357/71 |
| 4,998,157 | 3/1991 | Yokayama et al. | 437/200 |

FOREIGN PATENT DOCUMENTS

| | | | |
|---|---|---|---|
| 52-6468 | 1/1977 | Japan | 420/561 |
| 183037 | 6/1966 | U.S.S.R. | 420/561 |

*Primary Examiner*—Ngoc-Yen Nguyen
*Attorney, Agent, or Firm*—Ira David Blecker

[57] ABSTRACT

A ceramic substrate having an improved I/O pad adhesion layer. The ceramic substrate has an I/O pad for joining to an I/O pin. The I/O pad includes an improved adhesion layer of TiO, followed by layers of Ti (or Ti and Ni) and a solder wettable layer which may be Au or Pt. Also disclosed are low yield stress solders of Sn/Sb, Sn/Ag, Sn/Cu and Sn/Cu/Ti.

14 Claims, 1 Drawing Sheet

I/O PAD ADHESION LAYER FOR A CERAMIC SUBSTRATE

BACKGROUND OF THE INVENTION

This invention relates to a multilayer thin film metallic pad structure to be formed on a ceramic substrate for subsequent joining of input/output (I/O) pins. More particularly, this invention relates to a TiO layer for improving the adhesion of the pad structure to the ceramic substrate.

Ceramic substrates, usually and preferably multilayered, are used in the production of electronic substrates and devices. Many different types of structures can be used, and a few of these structures are described below. For example, a multilayered ceramic circuit substrate may comprise patterned metal layers which act as electrical conductors sandwiched between ceramic layers which act as insulators. The substrates may be designed with termination pads for attaching semiconductor chips, connector leads, capacitors, resistors, I/O connector pads, etc. Interconnection between buried conductor levels can be achieved through vias formed by metal paste-filled holes in the individual ceramic layers formed prior to lamination, which, upon sintering, will become a sintered dense metal interconnection of metal-based conductor.

In general, conventional ceramic substrates are formed from ceramic greensheets which are prepared by mixing a ceramic particulate, a thermoplastic polymer binder, plasticizers, and solvents. This composition is spread or cast into ceramic sheets or slips from which the solvents are subsequently volatilized to provide coherent and self-supporting flexible greensheets. After blanking, stacking and laminating, the green sheets are eventually fired at temperatures sufficient to drive off the polymeric binder resin and sinter the ceramic particulates together into a densified substrate.

The electrical conductors used in formation of the electronic substrate may be high melting point metals such as molybdenum and tungsten or a noble metal such as gold. However, it is more desirable to use a conductor having a low electrical resistance and low cost, such as copper and alloys thereof.

With respect to I/O pads, there are inherent thermal stresses experienced in the ceramic substrate due to the thermal coefficient of expansion (TCE) mismatch between the I/O pads and the ceramic substrate. The thermal stresses can lead to cracking of the ceramic substrate or delamination of the I/O pads. This problem has been found to be particularly serious in glass ceramic materials such as those disclosed in Kumar et al. U.S. Pat. No. 4,301,324, the disclosure of which is incorporated by reference herein.

In an effort to reduce these thermal stresses, Arnold et al. U.S. Pat. No. 4,835,593, the disclosure of which is incorporated by reference herein, have proposed a thin film I/O pad structure consisting of, for example, a titanium adhesion layer, a thick stress-reducing layer of copper or nickel, a barrier layer of titanium and a solder wettable layer of gold.

The use of TiO as an adhesion layer in a low stress thin film I/O pad has so far gone unappreciated in the prior art.

Bhattacharya U.S. Pat. No. 4,514,751 have proposed an adhesion layer of titanium with interstitial oxygen (not TiO) for the contact metallurgy of an integrated circuit device.

It is, therefore, an object of the present invention to have an improved adhesion layer for an I/O pad that is to be formed on a ceramic substrate.

It is another object of the present invention to have a low stress I/O pad that will not cause cracking of the ceramic substrate or result in delamination of the I/O pad.

It is yet another object of the present invention to have an improved adhesion layer made from TiO.

These and other objects of the invention will become apparent after referring to the following description considered in conjunction with the accompanying drawings.

BRIEF SUMMARY OF THE INVENTION

The objects of the invention have been achieved by providing a ceramic structure comprising:
a ceramic substrate; and
an I/O pad wherein said I/O pad comprises an adhesion layer of TiO in direct contact with said ceramic substrate.

DETAILED DESCRIPTION OF THE INVENTION

Figure 1:
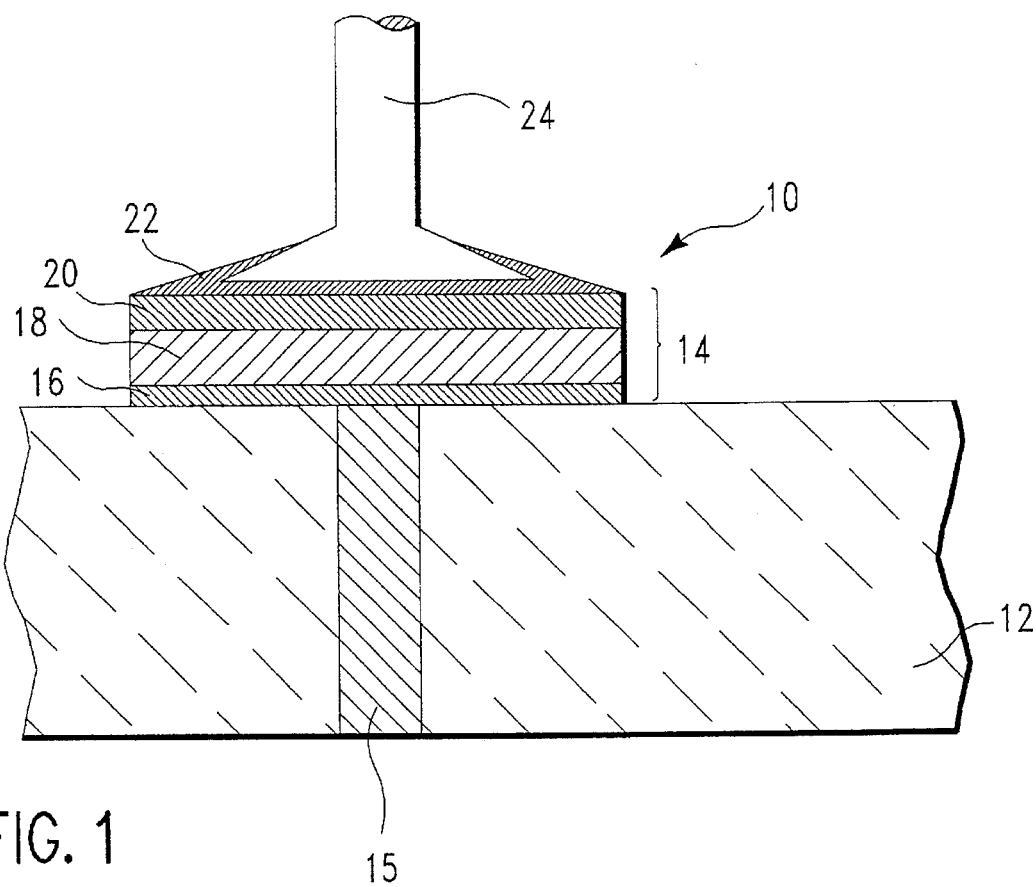
FIG. 1 is a partial cross-sectional view of a first embodiment of a ceramic substrate having the improved I/O pad adhesion layer according to the present invention.

Referring to the drawings in more detail, and particularly referring to FIG. 1, there is shown a first embodiment of a ceramic structure, generally indicated by 10, which is especially suitable for electronic applications. One such electronic application may be as a carrier for semiconductor devices or chips. The ceramic structure 10 comprises a ceramic substrate 12 and I/O pad 14.

There may be one or more vias 15 in contact with I/O pad 14.

The particular characteristics of the ceramic substrate are unimportant to the present invention. That is, it may be monolithic or multilayer. Further, it may be made from a variety of materials including alumina, mullite, cordierite and spodumene glass ceramic, borosilicate glass, etc. The preferred material is the cordierite glass ceramic material.

The first and foremost attribute of the I/O pad 14 is that it have a TiO adhesion layer 16 in direct contact with the ceramic substrate 12. The TiO adhesion layer is important in preventing delamination of any subsequent layers of the I/O pad. It has been found that TiO works very well in practice as an adhesion layer. It is preferred that the TiO adhesion layer 16 be present in the thickness range of 200 to 1000 Angstroms.

Following the TiO adhesion layer 16 is a layer of Ti 18 in direct contact with the TiO layer 16. The layer of Ti 18 is necessary for adhesion to TiO and also as a solder barrier. A layer of solder wettable material 20 is then deposited in direct contact with the Ti layer 18. Preferred solder wettable materials are Au and Pt but Ni, Co and Cu are also suitable. Preferred thicknesses for the Ti layer 18 and solder wettable layer 20 are 2000 to 10,000 Angstroms and 1000 to 10,000 Angstroms, respectively.

Together, TiO adhesion layer 16, Ti layer 18 and solder wettable layer 20 make up the I/O pad 14.

The ceramic structure 10 may further comprise a layer of solder 22 in contact with the I/O pad 14 and and I/O pin 24 in contact with the solder layer 22. It has been found that this I/O pad works well in adhering I/O pins without the necessity of the thick stress-reducing layer of the prior art.

Preferred solders for the solder layer 22 of the present invention are Sn-based and may include as alloying elements Sb, Ag, Cu, Ti and alloys and mixtures thereof. Some examples, in weight percent are: Sn with 2–7% Sb, Sn with 3–6% Ag, Sn with 1–3% Cu and Sn with 1–3% Cu and 1–2% Ti. These are low yield stress solders and serve to lessen the thermal stresses experienced by the ceramic substrate.

Figure 2:
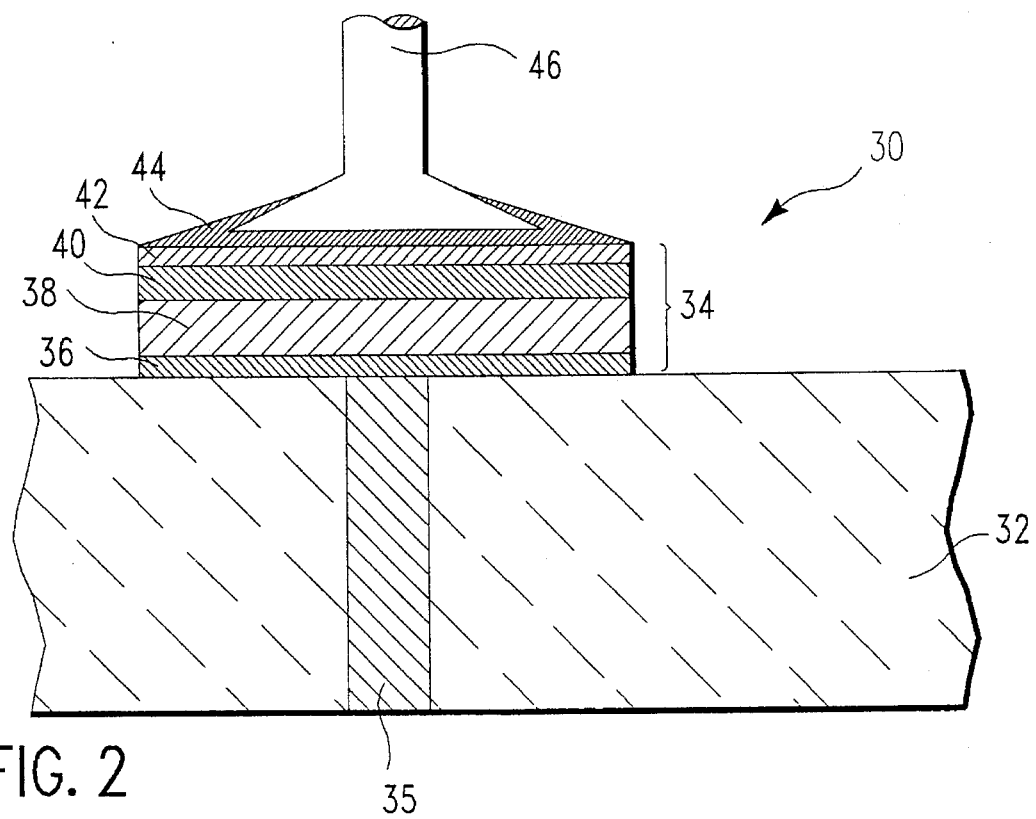
FIG. 2 is a partial cross-sectional view of a second embodiment of a ceramic substrate having the improved I/O pad adhesion layer according to the present invention.

Referring now to FIG. 2, there is shown a second embodiment of the ceramic structure, generally indicated by 30.

As in the previous embodiment, ceramic substrate 32 may have at least one via therein on top of which is I/O pad 34. The I/O pad comprises a TiO adhesion layer 36 followed by a layer of Ti 38. In this embodiment in FIG. 2, there is an additional layer of Ni 40. The thickness of the Ni layer is in the range of 1000 to 40,000 Angstroms. Thereafter, the I/O pad 34 may further comprise an optional solder wettable layer 42. Since Ni is a solder wettable material, a further solder wettable layer may not be necessary or desirable. If there is a solder wettable layer 42, the preferred solder wettable materials are Au and Pt but Co and Cu are also suitable.

On top of I/O pad 34, there is solder layer 44 and I/O pin 46.

Except for the presence of the Ni layer 40, the embodiment of FIG. 2 is identical to the embodiment of FIG. 1.

Each of the layers may be deposited by a number of methods, as those skilled in the art can appreciate. Two preferred methods of deposition of these layers are physical vapor deposition and plating.

The objects and advantages of the invention will become more apparent after referring to the following examples.

EXAMPLES

Example I

A cordierite glass ceramic substrate was prepared with an I/O pad according to the present invention.

The I/O pad was formed directly on the ceramic surface. The I/O pad consisted of a TiO adhesion layer (500 Angstroms) followed by layers of Ti (5000 Angstroms), Ni (2000 Angstroms) and Au (2500 Angstroms). The various layers were deposited by evaporation. I/O pins were soldered to the I/O pads with a Sn-5 weight % Sb solder. The pins were then pulled to failure. The minimum pull strength was 11 pounds.

An identical ceramic structure was prepared but was subjected to 6 solder reflows at 350 degrees C. The minimum pull strength was 8 pounds.

Example II

A ceramic structure was prepared in a manner similar to that of Example I except that the I/O pad structure consisted of layers of TiO (500 Angstroms), Ti (5000 Angstroms) and Pt (5000 Angstroms). Pins were soldered to the I/O pad with the above Sn-Sb solder. Pin pull results indicated a minimum pull strength of 5 pounds.

Example III

A ceramic structure was prepared in a manner similar to that of Example II except that the I/O pad structure consisted of layers of TiO (500 Angstroms), Ti (5000 Angstroms) and Au (2500 Angstroms). Pin pull results indicated a minimum pull strength of 5 pounds.

For each of the ceramic structures of Examples I, II, and III, 80–100 pins were pulled. It was observed that there were no failures in the I/O pad and no failures as a result of delamination of the I/O pad from the ceramic material. The failures that did occur were either non-shank failures that were the result of fracture in the solder or pin-solder interface or shank failures that were the result of shank fracture of the pin.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A ceramic structure for electronic applications comprising:

a ceramic substrate;

an I/O pin pad wherein said I/O pin pad comprises an adhesion layer of TiO in direct contact with said ceramic substrate, a layer of Ti in direct contact with said TiO layer, and a solder wettable layer over said Ti layer;

a layer of solder in contact with said I/O pin pad; and an I/O pin in contact with said solder layer.

2. The ceramic structure of claim 1 wherein said solder wettable layer is selected from the group consisting of Au, Pt, Ni, Co and Cu.

3. The ceramic structure of claim 1 wherein said I/O pin pad further comprises a layer of Ni in direct contact with said Ti layer.

4. The ceramic structure of claim 3 wherein said solder wettable layer is selected from the group consisting of Au, Pt, Co and Cu.

5. The ceramic structure of claim 1 wherein said solder having a composition of Sn and an alloying element selected from the group consisting of Sb, Ag, Cu, Ti, alloys and mixtures thereof.

6. The ceramic structure of claim 5 wherein said alloying element is 2 to 7 weight percent Sb.

7. The ceramic structure of claim 5 wherein said alloying element is 3 to 6 weight percent Ag.

8. The ceramic structure of claim 5 wherein said alloying element is 1 to 3 weight percent Cu.

9. The ceramic structure of claim 5 wherein said alloying element is 1 to 3 weight percent Cu and 1 to 2 weight percent Ti.

10. The ceramic structure of claim 1 wherein said ceramic substrate comprises cordierite.

11. The ceramic structure of claim 1 wherein said layer of TiO has a thickness of 200 to 1000 Angstroms.

12. The ceramic structure of claim 1 wherein said layer of Ti has a thickness of 2000 to 10000 Angstroms.

13. The ceramic structure of claim 3 wherein said layer of Ni has a thickness of 1000 to 40,000 Angstroms.

14. The ceramic structure of claim 1 wherein said solder wettable layer has a thickness of 1000 to 10,000 Angstroms.

\* \* \* \* \*